United States Patent
Teggatz et al.

(10) Patent No.: US 6,169,309 B1
(45) Date of Patent: Jan. 2, 2001

(54) HIGH BREAKDOWN-VOLTAGE TRANSISTOR WITH TRANSIENT PROTECTION

(75) Inventors: Ross E. Teggatz, McKinney; Joseph A. Devore, Richardson; David J. Baldwin, Allen, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/159,947

(22) Filed: Sep. 24, 1998

(51) Int. Cl.[7] .......................... H01L 29/76; H01L 29/54; H01L 31/062
(52) U.S. Cl. ............................. 257/328; 257/335
(58) Field of Search ..................... 257/328, 335, 257/648

(56) References Cited

U.S. PATENT DOCUMENTS 5,159,207 * 10/1992 Pavlin et al. .
5,777,362 * 7/1998 Pearce .
5,825,065 * 10/1998 Corsi et al. .

* cited by examiner

*Primary Examiner*—Stephen D. Meier
(74) *Attorney, Agent, or Firm*—Carlton H. Hoel; W. James Brady; Frederick J. Telecky, Jr.

(57) ABSTRACT

A circuit for protecting a transistor against electrical transients. The circuit comprises a first diode coupled between a first terminal coupled to a power supply and a control terminal of the protected transistor. The circuit also comprises a second diode and a resistor coupling the control terminal of the protected transistor to a reference potential. A second transistor is coupled in shunt to the protected transistor. The voltage on the control terminal of the second transistor is determined by the current through the resistor. The embodiments may be implemented in an integrated circuit wherein the second, shunting transistor is formed from parasitic elements within the semiconductor body in which the protected transistor is formed. In one embodiment, the protected MOS transistor is formed in an n-well 504 and a shunting bipolar transistor is formed between the n-well 504 and an n-doped guard ring 500 formed adjacent to the n-well in the p-doped substrate 508.

7 Claims, 3 Drawing Sheets

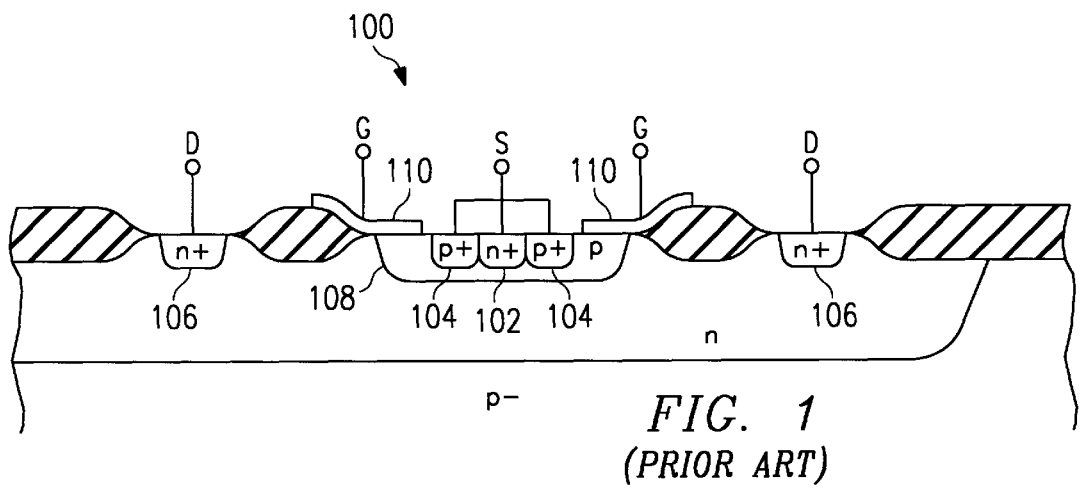
FIG. 1
(PRIOR ART)
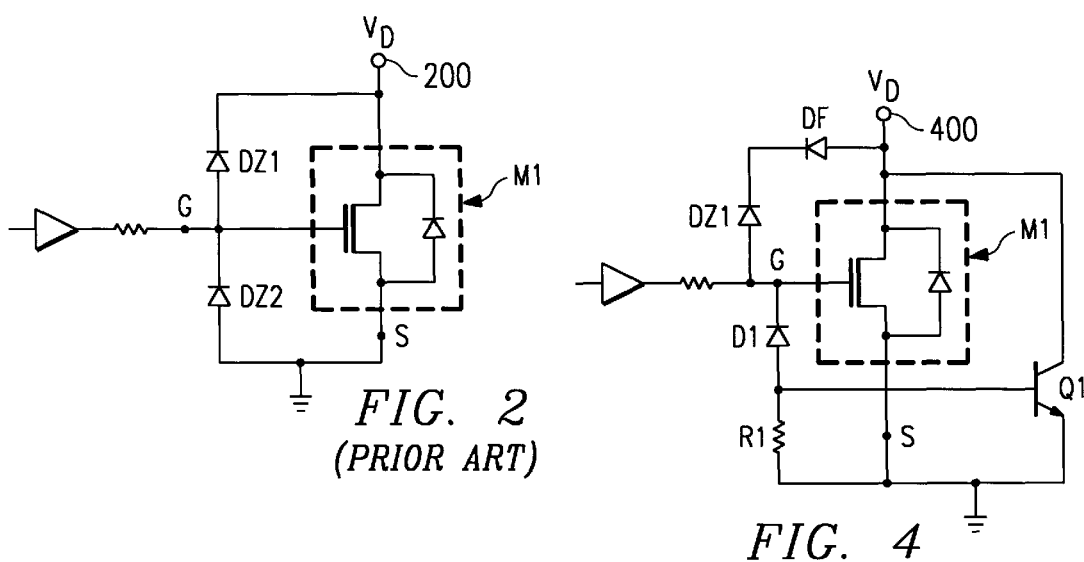
FIG. 2
(PRIOR ART)
FIG. 4
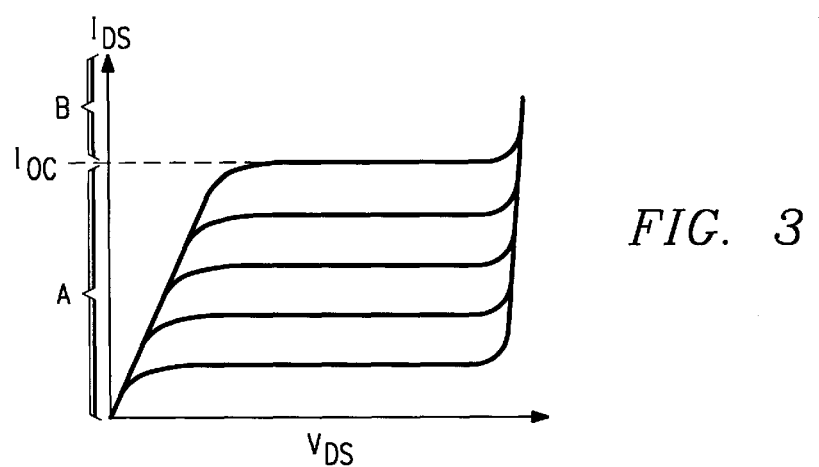
FIG. 3

HIGH BREAKDOWN-VOLTAGE TRANSISTOR WITH TRANSIENT PROTECTION

FIELD OF THE INVENTION

This invention relates to semiconductor devices, and more specifically to power transistor circuits designed to withstand electrical transients.

BACKGROUND OF THE INVENTION

Output drive circuits for power applications require rugged high-breakdown voltage transistors that can withstand a harsh high-voltage, high-current environment. A common transistor for such applications is the lateral double-diffused metal-oxide-semiconductor transistor (LDMOS), which, despite its name, typically has a gate composed of highly-doped polycrystalline silicon rather than metal. FIG. 1 shows a typical LDMOS transistor 100. In operation, the source 102 and back gate 104 are typically coupled to electrical ground, and the drain 106 is coupled to a positive voltage supply. In the transistor's active state, a channel is formed in the p-type region 108 beneath the poly gate 110 by applying a positive voltage to the gate.

FIG. 2 is a schematic diagram of a prior art low-side LDMOS circuit. The breakdown of the zener diode stack DZ1 forward biases the gate-source junction of the MOS transistor M1 in the event of electrical transients on the drain terminal 200. Such a transient may occur in an electrostatic discharge (ESD) event, for example, or as a result of inductive flyback from the drain bias network when the drain voltage supply is powered off. To protect the MOS transistor, the voltage drop of the zener stack plus the gate-to-source voltage drop should be less than the avalanche breakdown voltage of the MOS device. Certain transients may create a current between the gate and source terminals that may exceed the saturation current of the transistor. Such an over-current condition can result in catastrophic failure of the transistor. The current-voltage plot of FIG. 3 illustrates the safe operating region A of the transistor and the region B in excess of the over-current limit. Because the protection approach shown in FIG. 2 is ineffective in handling such over-current conditions, a more effective approach is needed.

SUMMARY OF THE INVENTION

In accordance with an embodiment of the invention, there is disclosed a circuit for protecting a transistor against electrical transients. The circuit comprises a first diode coupled between a power-supply-coupled first terminal and a control terminal of the protected transistor. The circuit also comprises a second diode and a resistor coupling the control terminal of the protected transistor to a reference potential. A second transistor is coupled in shunt to the protected transistor. The voltage on the control terminal of the second transistor is determined by the current through the resistor. The embodiments may be implemented in an integrated circuit wherein the second, shunting transistor is formed from parasitic elements within the semiconductor body in which the protected transistor is formed. In one embodiment, the protected MOS transistor is formed in an n-well and a shunting bipolar transistor is formed between the n-well and an n-doped guard ring formed adjacent to the n-well in the p-doped substrate.

One embodiment in accordance with the invention is a circuit including a first transistor. The first transistor includes a control terminal, a first terminal coupled to a power supply, and a second terminal coupled to a first reference potential. A first diode is coupled between the first terminal and the control terminal of the first transistor, while a second diode and a resistor are coupled between the control terminal of the first transistor and the first reference potential. The circuit also includes a second transistor, which includes a control terminal, a first terminal coupled to the power supply, and a second terminal coupled to a second reference potential. The control terminal of the second transistor is coupled between the second diode and the resistor.

Another embodiment is an integrated circuit including a semiconductor substrate doped a first conductivity type. A transistor is formed in a first doped region in the substrate, and the first doped region is doped a second conductivity type. A second doped region lies in the substrate adjacent and spaced apart from the first doped region, the second doped region being doped the second conductivity type. The integrated circuit also includes a base region, which is the region of the substrate between the first doped region and the second doped region. A base contact is made to the base region, and a contact is also made to the substrate elsewhere.

An advantage of the inventive concepts is that a circuit for protecting a transistor against voltage transients may be obtained from circuit elements, a guard-ring structure for example, conventionally available on an integrated circuit, but not heretofore utilized for this purpose. In addition, the concepts described do not rely on semiconductor-controlled rectifier (SCR) circuits, and thus avoid the risk of latching that those protective circuits present.

BRIEF DESCRIPTION OF THE DRAWINGS

The foregoing features of the present invention may be more fully understood from the following detailed description, read in conjunction with the accompanying drawings, wherein:

FIG. 1 is a cross-sectional view of a prior art LDMOS transistor;

FIG. 2 is a schematic diagram of a prior art LDMOS circuit with transient protection in the form of zener diode stacks;

FIG. 3 is a current-voltage plot of an MOS transistor indicating the safe operating range and the over-current range in which the transistor is at risk of failure;

FIG. 4 is a schematic diagram of a first preferred embodiment in accordance with the invention;

DETAILED DESCRIPTION OF PREFERRED EMBODIMENTS

MOS transistors inherently include parasitic bipolar transistors. The ready availability of such parasitic bipolars can be used advantageously to create transient protection circuitry for the host MOS transistor. SCR circuits can often be configured from these parasitic bipolars, but SCRs are prone to latching in a conductive state. Consequently, an alternative approach is desirable. A first preferred embodiment in accordance with the invention, a protection circuit for a transistor, is shown schematically in FIG. 4. The bipolar transistor Q1 shunts current from MOS transistor M1 an over-current event, resulting in a more rugged transistor structure than in the structure shown in FIG. 2. In the circuit of FIG. 4, when a voltage transient occurs at the transistor's drain terminal 400, the zener stack DZ1 breaks down and applies a bias voltage on the gate of the MOS transistor M1, turning it on. As the current through the transistor increases, the gate-source voltage becomes large enough to break down the zener D1. The current through R1 resulting from the breakdown of D1 produces a voltage across R1 that is sufficient to forward bias the base-emitter junction of Q1. Q1 becomes active, shunting the otherwise destructive current from M1. Diode DF prevents a gate-to-drain supply path in the event of a gate voltage in excess of the drain supply voltage. DF is inconsequential to the drain transient problem except that its voltage drop is taken into account in determining the size of zener stack DZ1.

Figure 5:
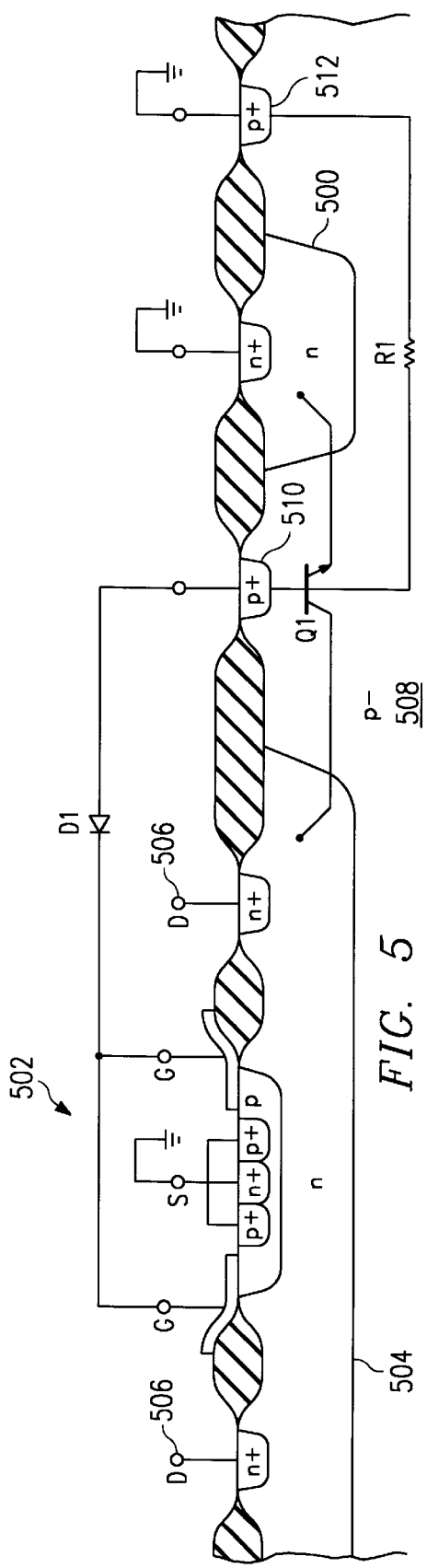
FIG. 5 is a cross-sectional diagram of an integrated circuit implementation of the circuit of FIG. 4 with schematic representations of FIG. 4 circuit elements superimposed.

FIG. 5 shows a cross-section of an integrated circuit implementation of the circuit of FIG. 4. The layout makes use of a guard ring 500 to form an NPN transistor to shunt over-current from the MOS transistor 502. A guard ring is a doped region that surrounds or encircles a well such as n-well 504 to provide latch-up protection for the MOS transistor 502 and any surrounding circuitry. Guard rings can be placed outside the well (as shown in FIG. 5) or inside the well, and can be either a minority-carrier structure, as in FIG. 5, or a majority-carrier structure. In the event that the voltage at the drain terminal 506 of the MOS transistor is negative, electrons are injected into the p-type silicon substrate 508. Guard ring 500 is typically coupled to electrical ground, as indicated in FIG. 5, so the injected electrons are collected by the guard ring. On the other hand, the p+ regions 510 and 512 are majority-carrier guard structures that help protect against latch-up in conventional circuits by lowering the resistance in the substrate and thus de-biasing the base-emitter junction of the parasitic bipolar shown schematically in FIG. 5. The layout of FIG. 5 takes advantage of the resistance R1 between the p+ moats 510 and 512 to tailor the performance of the bipolar transistor Q1 to protect the MOS transistor 502 from over-current conditions. R1 is typically on the order of 100 ohms, so that under the normal operating conditions of the MOS transistor 502, the base emitter voltage is well below the level at which the parasitic bipolar transistor Q1 becomes active. One skilled in the art will appreciate that the doping polarities that result in an n-channel LDMOS transistor and an NPN bipolar transistor may be reversed to create a p-channel MOS device and a PNP bipolar device that functions similarly to the circuit shown in FIGS. 4 and 5. In addition, though a guard ring is used in this embodiment in the formation of the parasitic bipolar transistor, it may be appreciated that other suitable n-wells in the integrated circuit could also be used.

Figure 6:
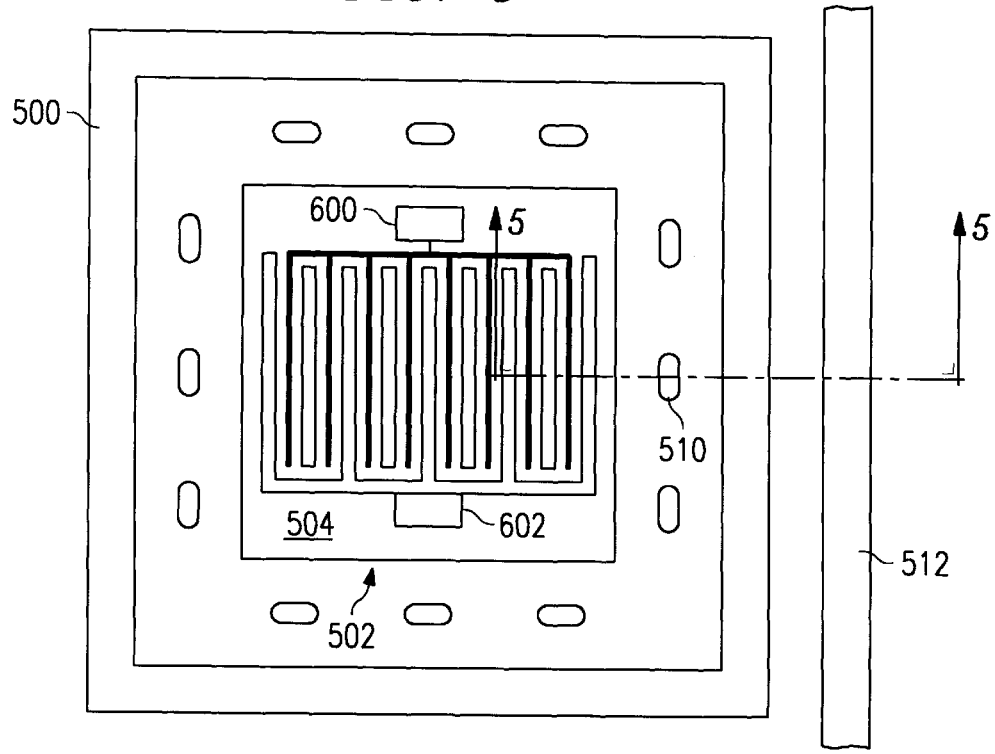
FIG. 6 is a plan-view layout sketch of the implementation shown in cross-section in FIG. 5.

FIG. 6 is a plan view of the layout of FIG. 5. The guard ring 500 is shown to encircle the n-well 504 in which the MOS transistor 502 is fabricated. The majority-carrier guard structures 510 and 512 are adjacent the minority-carrier ring 500 as shown. Note that the LDMOS transistor 502 is typical a large gate-periphery device with many drain, source, and gate fingers as shown in FIG. 6. Contacts to the gate and drain are represented in FIG. 6 by pads 600 and 602. The contact to the source fingers is not shown for clarity.

Figure 7:
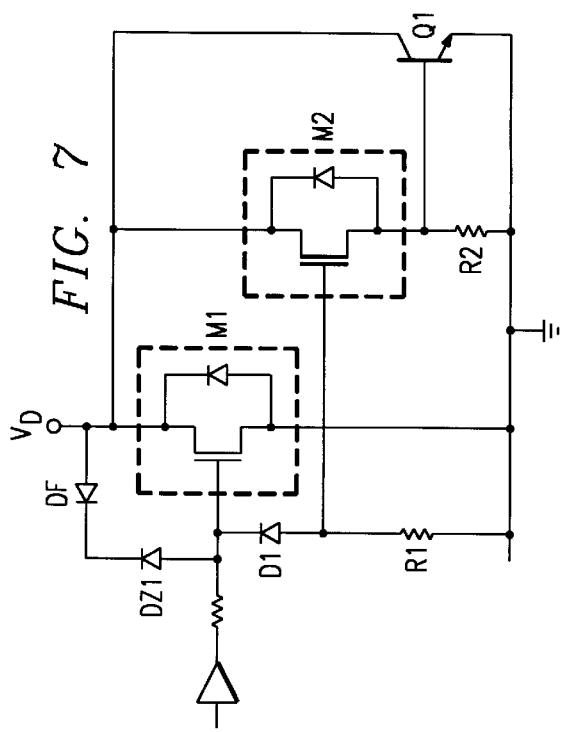
FIG. 7 is a schematic diagram of a second preferred embodiment in accordance with the invention.

FIG. 7 is a second preferred embodiment in accordance with the invention. The circuit of FIG. 7 includes a second MOS transistor, M2, configured as a source-follower to the M1 primary transistor. M2 serves to increase the current available to the base of the NPN bipolar transistor Q1 and allows a reduction in the size and current-handling ability of the zener diodes, DF, DZ1, and D1.

Figure 8:
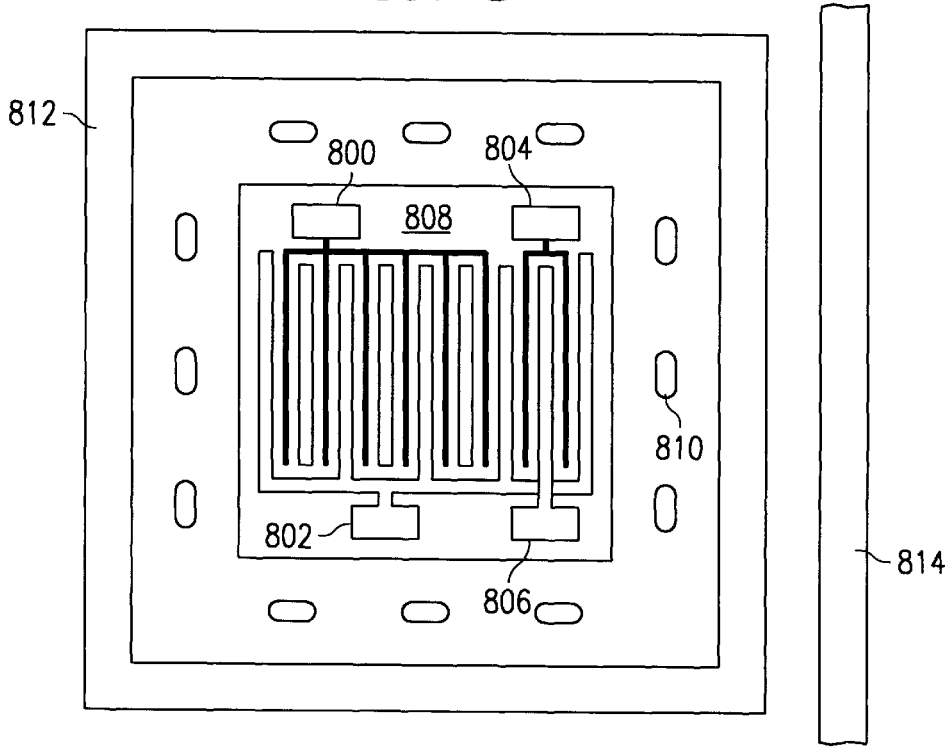
FIG. 8 is a plan-view layout sketch of portions of the circuit shown in FIG. 7.

A sketch of a layout for the circuit of FIG. 7 is shown in FIG. 8. The layout is similar to that shown in FIG. 6, except that provision for the second transistor M2 is made. As in FIG. 6, gate 800 and drain 802 pads allow access to the transistor for connection to other components in the integrated circuit. The layout also includes a second gate pad 804 and a source pad 806 to facilitate the circuit connections shown in FIG. 7. Note also that the M2 transistor may have a much smaller gate periphery than the M1 transistor. The n-well 808, majority-carrier guard structures 810 and 814, and minority-carrier guard ring 812 are as described above for FIG. 6.

Figure 9:
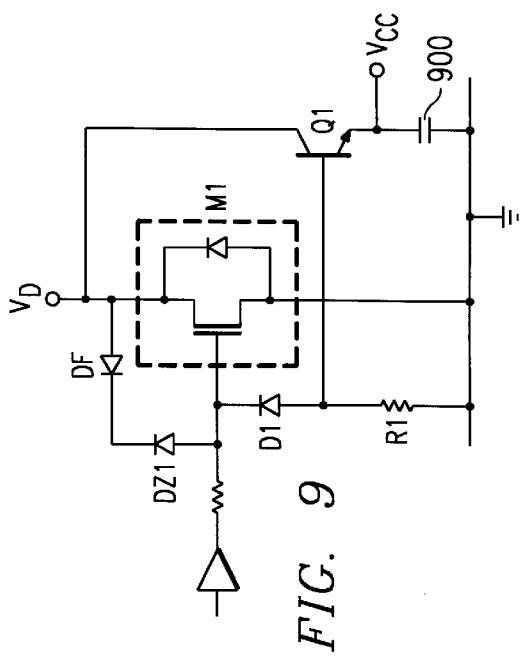
FIG. 9 is a schematic diagram of a third preferred embodiment in accordance with the invention.

FIG. 9 is a third preferred embodiment in accordance with the invention. The circuit of FIG. 9 is similar to that of FIG. 4, except that rather than coupling the emitter of bipolar transistor to electrical ground, the emitter in the circuit of FIG. 9 is coupled to a positive voltage supply, Vcc in this embodiment. Vcc is then coupled to electrical ground through a bypass capacitor 900. This configuration requires that a voltage of Vcc+0.7 V be applied to the base of Q1 before the shunting of over-current begins. An advantage of this approach is that the zener diode D1 could be eliminated since the Vcc applied to the emitter ensures that premature activation of Q1 will not occur during normal circuit operation.

During ESD or other high-frequency transient events, the high frequency components are shorted to ground through the bypass capacitor 900. Additionally, damage from ESD strikes often occurs not when the circuit is installed in a system, but when it is being handled prior to installation. The circuit configuration of FIG. 9 is advantageous in that it offers ESD protection through the bypass capacitor 900 even without power supplied to the system. An additional advantage is that the guard ring (emitter of the bipolar transistor Q1) performs its guarding function, that is, attracting carriers injected into the substrate by a negative drain potential, when a positive bias is applied to the guard ring. Thus, in normal operation the MOS transistor and surrounding circuitry is better protected from latch-up than if the guard ring is simply coupled to electrical ground.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the primary transistor in the embodiment is described herein as a MOS or LDMOS transistor. It will be appreciated that the approaches to transient protection described above may also apply to the protection of other types of devices and circuits. Also, though the embodiments describe an n-channel MOSFET, it will be appreciated that the p-channel configuration is within the scope of the invention as well. In addition, shallow trench isolation may be used rather than the field oxide shown in the embodiments. Gate materials other than polycrystalline silicon, metal for example, may also be used. Reduced surface field (RESURF) techniques may be used to distribute dopants in addition to ion implantation. Aspects of the invention may benefit vertical DMOS devices and other types of power devices as well as the LDMOS embodiments shown. It is therefore intended that the appended claims encompass any such modifications or embodiments. Note also that the dopant concentration designations n−, p−, n, p, n+, and p+ are intended to denote relative concentrations, with n and p representing a higher doping concentration than n− and p−, and n+ and p+ representing a higher doping concentration than n and p. The actual dopant concentration denoted by each symbol varies with semiconductor material and dopant. The circuits and devices described herein may be implemented in silicon-based integrated circuits or in compound semiconductor integrated circuits.

What is claimed is:

1. An integrated circuit, comprising:
   a semiconductor substrate doped a first conductivity type;
   a transistor formed in a first doped region in said substrate, said first doped region being doped a second conductivity type;
   a second doped region in said substrate adjacent and spaced apart from said first doped region, said second doped region being doped said second conductivity type;
   a base region of said first conductivity type in said substrate between said first doped region and said second doped region, said base region abutting both said first doped region and said second doped region;
   a base contact to said base region; and
   a contact to said substrate.

2. The integrated circuit of claim 1, wherein said second doped region is a guard ring.

3. The integrated circuit of claim 1, wherein said transistor comprises a control terminal, said control terminal coupled to said base contact.

4. The integrated circuit of claim 3, wherein said coupling of said control terminal and said base contact includes a diode, an anode of said diode coupled to said base contact and a cathode of said diode coupled to said control terminal.

5. The integrated circuit of claim 1, wherein said second doped region is coupled to a reference potential.

6. The integrated circuit of claim 5, wherein said reference potential is electrical ground.

7. The integrated circuit of claim 4, wherein said contact to said substrate is coupled to a reference potential.

* * * * *

UNITED STATES PATENT AND TRADEMARK OFFICE
CERTIFICATE OF CORRECTION

PATENT NO.    : 6,169,309 B1                                              Page 1 of 1
DATED         : January 2, 2001
INVENTOR(S)   : Ross E. Teggatz, Joseph A Devore and David J. Baldwin It is certified that error appears in the above-identified patent and that said Letters Patent is hereby corrected as shown below:

<u>Title page,</u>
Insert --          Related U.S. Application Data
        [60]  Provisional Application No. 60/060,437 filed 09/30/1997. --

Signed and Sealed this

Eleventh Day of March, 2003

JAMES E. ROGAN
*Director of the United States Patent and Trademark Office*